(12) United States Patent
Balp et al.

(10) Patent No.: US 7,053,360 B2
(45) Date of Patent: May 30, 2006

(54) CAPACITIVE TYPE CONTROL MEMBER HAVING A TOUCH SENSITIVE DETECTOR

(75) Inventors: Lionel Balp, Audincourt (FR); Denis Bocquet, Essert (FR); Christian Henigue, Audincourt (FR); Jean-Luc Roudot, Seloncourt (FR)

(73) Assignee: Faurecia Industries, Nanterre (FR)

( * ) Notice: Subject to any disclaimer, the term of this patent is extended or adjusted under 35 U.S.C. 154(b) by 314 days.

(21) Appl. No.: 10/408,315

(22) Filed: Apr. 8, 2003

(65) Prior Publication Data

US 2003/0193013 A1    Oct. 16, 2003

(30) Foreign Application Priority Data

Apr. 16, 2002    (FR) .................................. 02 04744

(51) Int. Cl.
*G01J 1/36* (2006.01)

(52) U.S. Cl. .............................. 250/227.22; 250/227.24

(58) Field of Classification Search ........... 250/227.22, 250/227.21, 227.24, 214 LS, 214 SW; 200/600, 200/16 D, 512; 341/33
See application file for complete search history.

(56) References Cited

U.S. PATENT DOCUMENTS

| 3,950,846 A | 4/1976 | Johnson | |
|---|---|---|---|
| 4,901,074 A | 2/1990 | Sinn et al. | |
| 5,384,459 A | 1/1995 | Patino et al. | |
| 6,621,029 B1 * | 9/2003 | Galmiche et al. | ............ 200/600 |
| 6,723,937 B1 * | 4/2004 | Englemann et al. | ........ 200/600 |

FOREIGN PATENT DOCUMENTS

EP    0 887 934 A1    12/1998

* cited by examiner

*Primary Examiner*—Que T. Le
(74) *Attorney, Agent, or Firm*—Young & Thompson

(57) ABSTRACT

The member comprises: a support structure presenting a control zone, said control zone having a through hole; a non-conductive elastic covering covering a control face of the control zone, at least in register with the through hole; and a touch-sensitive detector at least partially in register with the through hole and mounted on or in the vicinity of the face of the control zone that is opposite from its control face; the elastic covering having a rest position in which the finger of an operator contacting the free surface of the elastic covering lies outside the touch detection space of the detector, and a deformed position in which the finger of the operator in contact with the free surface of the elastic covering lies within the touch detection space of the detector. According to the invention, in the rest position, the elastic covering is spaced apart from the touch-sensitive detector, and in the deformed position, the elastic covering is in contact with the touch-sensitive detector.

10 Claims, 3 Drawing Sheets

CAPACITIVE TYPE CONTROL MEMBER HAVING A TOUCH SENSITIVE DETECTOR

The present invention relates to a control member of the capacitive type for controlling at least one functional member, in particular in a motor vehicle, and it also relates to a piece of vehicle equipment including such a member.

BACKGROUND OF THE INVENTION

Motor vehicle equipment is incorporating an increasing number of control members for controlling functional members of such vehicles.

Several pieces of equipment placed in a vehicle cabin receive control members of this type which are thus made available to users of the vehicle.

By way of example, these pieces of equipment can be constituted by door panels, the dashboard, or indeed a central console of the vehicle, etc. . . . .

In general, the control members are grouped together to make up control pads made up of various kinds of member, such as, for example: switches, pushbuttons, or knobs for turning, which members are integrated in the electrical control circuits for the functional members.

However, it will be understood that such members present certain drawbacks, in particular concerning their bulkiness and their lack of reliability, particularly since they make use of moving parts.

Another problem associated with using members of that type lies in the complexity of assembling them and installing them on board the vehicle which requires the use of assembly components (screws, a pad support plate, etc. . . . ) and assembly time that is relatively lengthy.

Touch-sensitive detectors are themselves also known in general terms.

Reference can be made for example to the following documents: FR-A-2 779 889, FR-A-2 737 359, U.S. Pat. No. 5,572,205, and U.S. Pat. No. 5,270,710.

Such detectors operate on the principle of detecting a change in capacitance, for example by means of an electrode placed on a printed circuit board under a zone for operating a control, with said change in capacitance subsequently being analyzed and processed by an electronic circuit that serves to control some function. Beneath a predetermined capacitance threshold, a control signal is not generated, and above the threshold, a control signal is generated.

Such detectors present the advantage of not requiring moving parts, but they suffer from a drawback of lack of feedback to the user, in particular in terms of feel.

Thus, for example, with a touch-sensitive system, such as that described in document U.S. Pat. No. 5,572,205, in which a rigid support is provided with a capacitive sensor on one face of the support and an operating zone in register therewith on the other face of the support, the user perceives no sensation of pressing on a button.

This can be troublesome, for example if the user is the driver of the vehicle and is pressing the control members "blind".

Without any tactile feedback, the user can end up pressing several times on the operation zone and runs the risk of not obtaining the desired effect.

Furthermore, this also leads to a problem of lack of concentration on driving the vehicle.

Document U.S. Pat. No. 4,022,296 describes a control unit having capacitive control switches which likewise give rise to such problems.

Document EP-02/290167.2 in the name of the Applicant describes a capacitive type control member for controlling at least one functional member, in particular of a motor vehicle, the control member comprising a rigid support structure, at least one capacitive cell for detecting touch and located on or close to one of the faces of said support structure, and at least one control operation zone located on or close to the other face of said support structure in register with the touch detection capacitive cell, the control operation zone comprising elastically deformable means. Thus, the user can feel displacement when pressing the operation zone. The perception of operating a control is thus greatly improved. In one embodiment, the elastically deformable means have a rest position in which the finger of the operator in contact with the operation zone lies outside the touch detection space, and a deformed position in which the finger of the operator in contact with the operation zone lies within the touch detection space. This characteristic makes it possible to monitor triggering of the control more securely by constraining the user to depress the operation zone in order to enter the touch detection space. The term "touch detection space" is used to mean the space in which the operator's finger causes a change in capacitance that goes beyond the predetermined capacitance threshold, thereby causing a control signal to be generated.

OBJECTS AND SUMMARY OF THE INVENTION

One of the objects of the present invention is to provide novel improvements to the above-described capacitive type control member in order to increase the user's perception and in order to improve the sensitivity of the touch detection space.

To this end, the invention provides a capacitive type control member comprising:

- a support structure presenting a control zone, said control zone having a through hole;
- a non-conductive elastic covering covering a control face of the control zone, at least in register with the through hole; and
- a touch-sensitive detector at least partially in register with the through hole and mounted on or in the vicinity of the face of the control zone that is opposite from its control face;
- the elastic covering having a rest position in which the finger of an operator contacting the free surface of the elastic covering lies outside the touch detection space of the detector, and a deformed position in which the finger of the operator in contact with the free surface of the elastic covering lies within the touch detection space of the detector;
- wherein, in the rest position, the elastic covering is spaced apart from the touch-sensitive detector, and in the deformed position, the elastic covering is in contact with the touch-sensitive detector.

In an embodiment of the invention, the touch-sensitive detector comprises a printed circuit having a touch detection electrode integrated thereon which is at least partially in register with the through hole, the elastic covering in the deformed position being directly in contact with the printed circuit.

In another embodiment of the invention, the touch-sensitive detector comprises a printed circuit having a touch detection electrode integrated thereon which is at least partially in register with the through hole, and an electrically non-conductive coupling piece which is at least partially in register with the through hole and with the electrode, the coupling piece having a first face mounted in direct contact with the printed circuit, and a second face that is in direct contact with the elastic covering in the deformed position.

According to another characteristic of this embodiment, the coupling piece comprises a light guide coupled with at least one light source.

According to another characteristic of this embodiment, the coupling piece comprises an assembly spacer between the printed circuit and the face of the control zone opposite from the control face.

According to a characteristic common to both embodiments, the elastic covering may be translucent, at least in register with the through hole.

According to another characteristic common to both embodiments, the elastic covering may present a pictogram in register with the through hole.

According to another characteristic common to both embodiments, the elastic covering presents a curve of resistance to depression between its rest position and its deformed position in the form of a slope that rises from the rest position to an intermediate position, and a slope that falls between the intermediate position and the deformed position.

The invention also provides a piece of motor vehicle cabin equipment comprising a self-supporting insert covered at least in part by a flexible skin, said equipment including at least one control member as described above.

The self-supporting insert constitutes at least one control zone of at least one control member.

The flexible skin constitutes the non-conductive elastic covering covering a control face of at least one control zone of at least one control member.

A first advantage of the present invention results from coming into abutment in the deformed position. This gives the user the impression of performing an action that has been completed, thus increasing the user's perception of actuating a control.

Another advantage of the present invention results from the continuity of solid material in the deformed position between the touch detection electrode and the user's finger. Electric field lines which are necessary in order to enable touch to be detected are sensitive to the media through which they pass. In particular, field lines tend to disperse in air. Having continuity of solids provides an effect of focusing electric field lines, which makes it possible to reduce the power needed for detection. Thus, the invention enables the user to be aware of activating a control, without that requiring the power needed for detection to be greater than the power needed by a conventional system without movement, as described in the prior art.

BRIEF DESCRIPTION OF THE DRAWINGS

Other advantages and characteristics of the present invention appear from the following description given with reference to the accompanying drawings, in which.

MORE DETAILED DESCRIPTION

Figure 1:
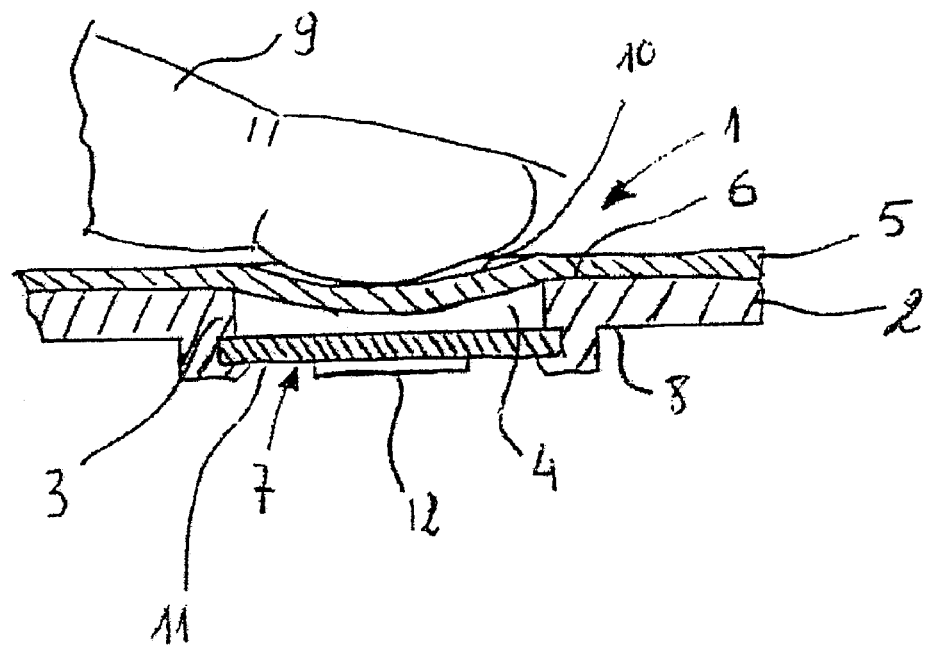
FIG. 1 is a diagrammatic section view of a control member of the present invention in its rest position.

The present invention relates to a control member 1 of the capacitive type, comprising:
- a support structure 2 presenting a control zone 3, said control zone 3 having a through hole 4;
- a non-conductive elastic covering 5 covering a control face 6 of the control zone 3, at least in register with the through hole 4; and
- a touch-sensitive detector 7 at least partially in register with the through hole 4 and mounted on or close to the face 8 of the control zone 3 that is opposite from its control face 6.

Figure 3:
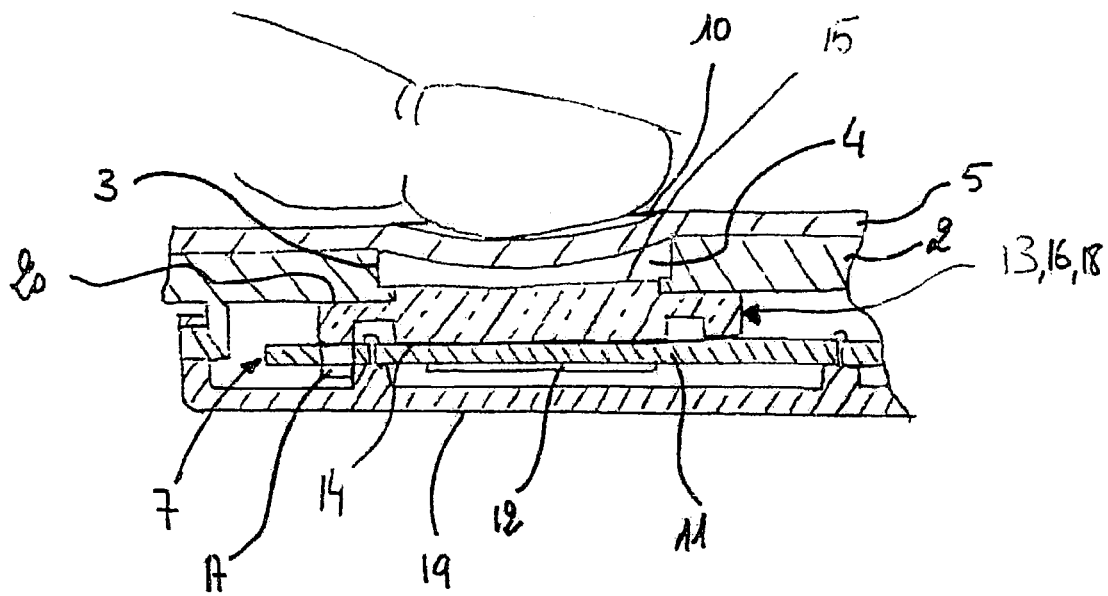
FIG. 3 is a diagrammatic section view of a control member constituting another embodiment of the present invention in its rest position.
Figure 5:
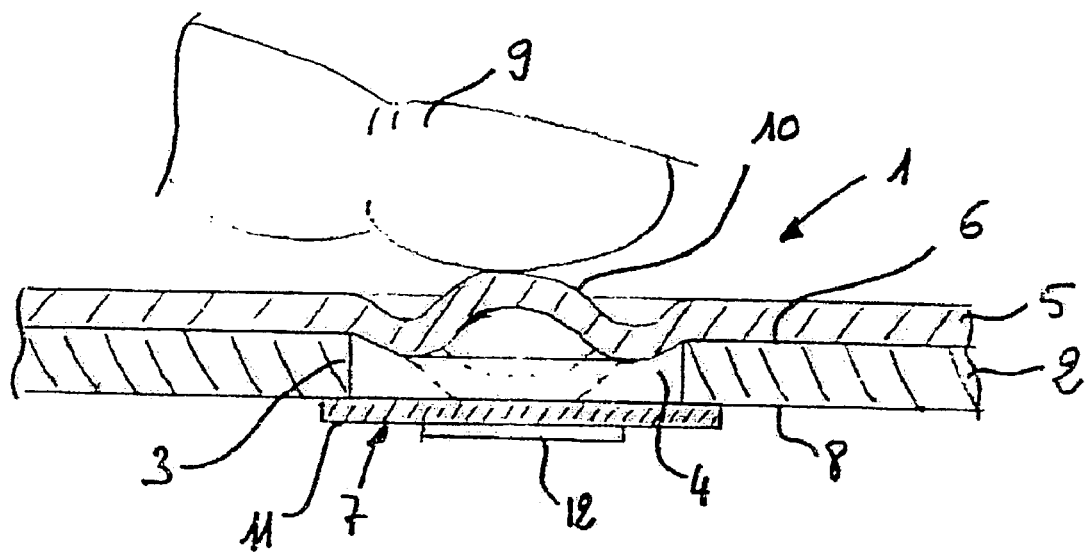
FIG. 5 is a diagrammatic section view of another embodiment of the invention in its rest position.

The elastic covering 5 has a rest position shown in FIGS. 1, 3, and 5 in which the finger 9 of an operator in contact with the free surface 10 of the resilient covering 5 lies outside the touch detection space of the detector 7, and a deformed position in which the finger 9 of the operator in contact with the free surface 10 of the elastic covering 5 lies within the touch detection space of the detector 7.

The term "touch detection space" is used to designate the space in which the operator's finger 9 generates a change in capacitance that goes beyond a predetermined capacitance threshold, thereby triggering the control signal.

According to the invention, in the rest position, the elastic covering 5 is spaced apart from the touch-sensitive detector 7, and in the deformed position the elastic covering 5 is in contact with the touch-sensitive detector 7.

Thus, to activate the control signal, the operator's finger 9 must deform the elastic covering to the deformed position in which the elastic covering comes into contact with the touch-sensitive detector. This serves firstly to avoid control signals being triggered in untimely manner by an operator inadvertently brushing over the control zone 3, and also serves to give the operator the impression of having accomplished an action when the finger is stopped while activating the control signal.

According to a characteristic of the present invention, the touch-sensitive detector 7 comprises a printed circuit 11 having integrated thereon a touch detection electrode 12 which is at least partially in register with the through hole 4.

Figure 2:
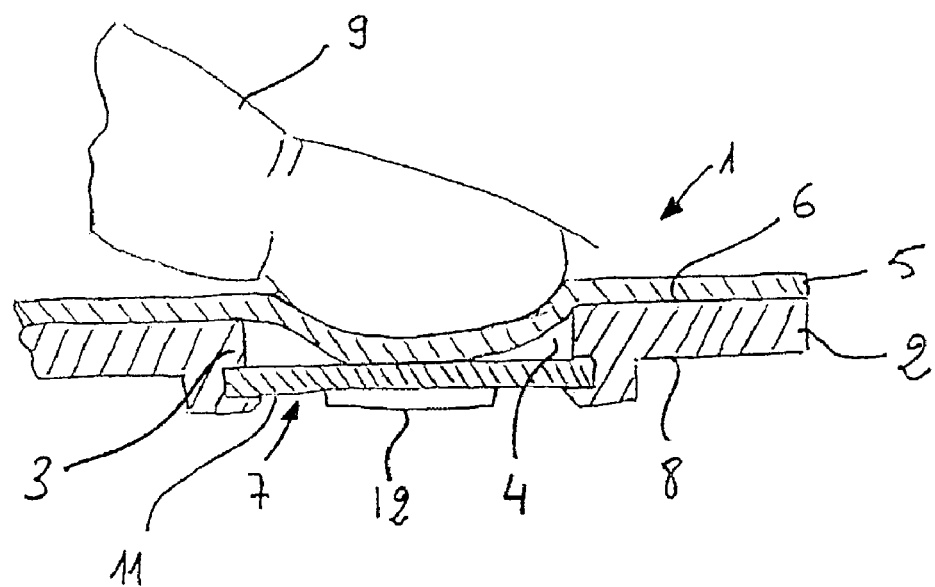
FIG. 2 is a view of the FIG. 1 control member in its deformed position.

In the embodiments shown in FIGS. 1, 2, and 5, when the elastic covering 5 is in its deformed position it is directly in contact with the printed circuit 11.

Figure 4:
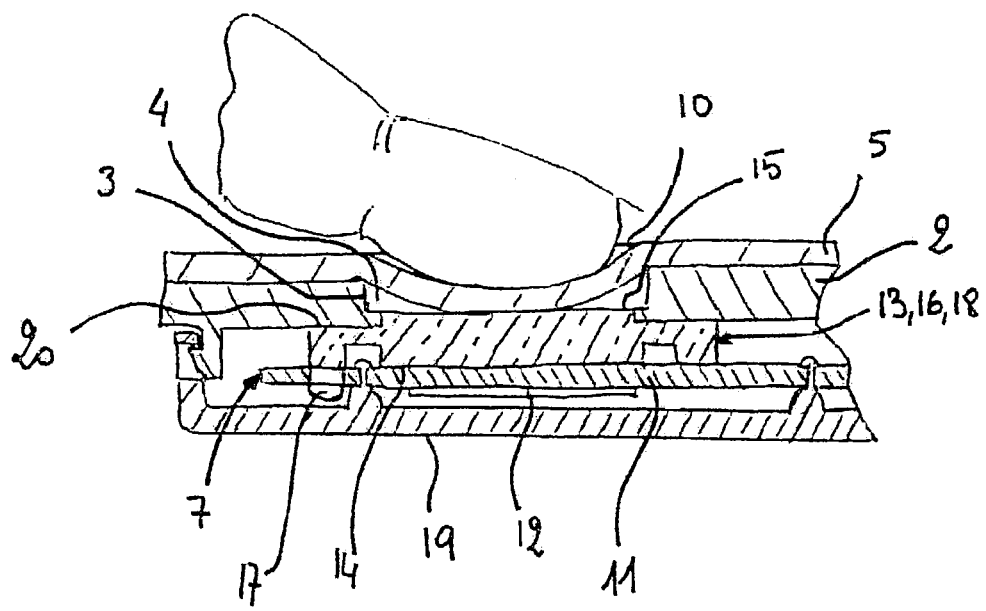
FIG. 4 is a view of the FIG. 3 embodiment of the control member in its deformed position.

In the embodiment shown in FIGS. 3 and 4, the control member further comprises an electrically non-conductive coupling piece 13 that is at least partially in register with the through hole 4 and the electrode 12, having a first face 14 mounted in direct contact with the printed circuit 11, and a second face 15 in direct contact with the elastic covering 5 in its deformed position.

To identify the function controlled by the control member, the elastic covering 5 advantageously presents a pictogram (not shown) over the through hole 4. This serves to clearly identify the control zone 3 visually.

Still for the same purpose, the elastic covering 5 presents a shape that is convex and/or concave in register with the through hole 4. Thus, an operator acting "blind" can find the control zone 3 more easily.

The coupling piece 13 advantageously comprises a light guide 16 coupled with at least one light source 17. This light source 17 can be integrated on the printed circuit 11.

Under such circumstances, the elastic covering 5 is at least partially translucent, at least in register with the through hole 4. The control zone 3 can thus be back-lit. In this embodiment, the pictogram can be disposed on or under the elastic covering 5, or it can be disposed on the light guide 16.

In the embodiment shown in FIGS. 3 and 4, the coupling piece 13 acts as an assembly spacer 18 between the printed circuit 11 and the face 8 of the control zone 3 opposite from the control face 6.

The printed circuit 11 is mounted on a casing 19 fitted under the support structure 2. The coupling piece 13 has shoulders 20 bearing against the face 8 of the control zone 3 that is opposite from the control face 6. This spacer function 18 contributes to ensuring that there is a minimum distance between the electrode 12 and the free surface 10 of the elastic covering 5 while it is in the rest position, thereby avoiding untimely triggering.

Figure 6:
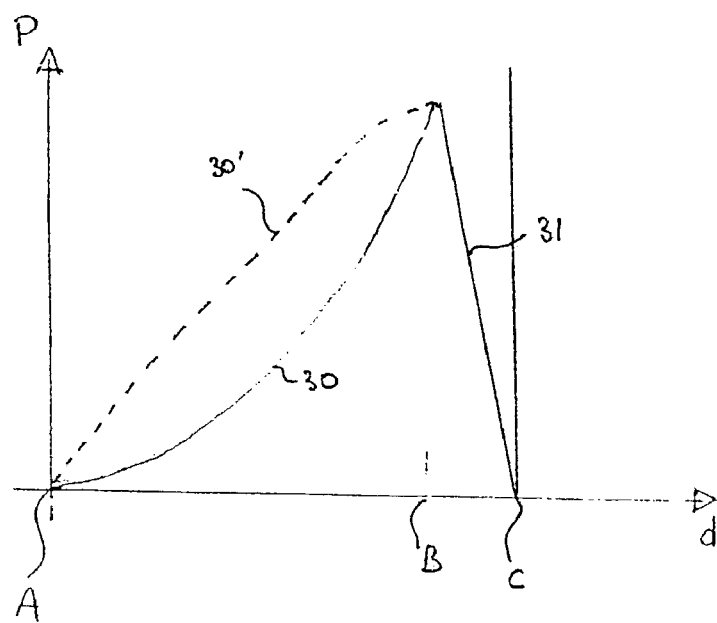
FIG. 6 is a graph plotting resistance to deformation as a function of deformation for a control member as shown in FIG. 5.

FIG. 5 shows an embodiment in which the elastic covering 5 over the through hole 4 is of a blister shape. The curve showing resistance P to depression d of the "blister" type elastic covering 5 between its rest position and its deformed position comprises a rising slope 30, 30' going from the rest position A to an intermediate position B, and a falling slope 31 between the intermediate position B and the deformed position C, as shown in FIG. 6.

This has the advantage of giving the operator the impression of triggering a control signal at the moment the slopes 30, 31 are reversed. Between the rest position A and the intermediate position B, the operator needs to increase the pressure P applied to the elastic covering in order to obtain the depression d. Between the intermediate position B and the final deformed position C, the pressure P needed collapses suddenly, giving the operator the impression of having toggled a switch.

The shape of the elastic covering 5 in FIG. 5 with alternating concentric convex and concave portions serves to obtain the above-described impression without requiring any mechanical moving parts.

The invention also provides a piece of motor vehicle cabin equipment comprising a self-supporting insert 2 covered at least in part by a flexible skin 5 and having at least one control member 1 as described above.

In particular, the self-supporting insert 2 may advantageously constitute at least one control zone 3 for at least one control member 1.

In addition, the flexible skin 5 may constitute the non-conductive elastic covering 5 covering a control face 6 of at least one control zone 3 of at least one control member 1.

An example of such a piece of motor vehicle equipment may be a central facade for a dashboard or an insert or an armrest for a door, or indeed a dashboard cover including an injected insert covered in a flexible skin, said insert being provided with at least one through hole covered by the flexible skin, and a touch-sensitive detector for controlling some function.

What is claimed is:

1. A capacitive type control member comprising:
a support structure presenting a control zone, said control zone having a through hole;
a non-conductive elastic covering covering a control face of the control zone, at least in register with the through hole;
a touch-sensitive detector at least partially in register with the through hole and mounted on or in the vicinity of the face of the control zone that is opposite from its control face;
the elastic covering having a rest position in which the finger of an operator contacting the free surface of the elastic covering lies outside the touch detection space of the detector, and a deformed position in which the finger of the operator in contact with the free surface of the elastic covering lies within the touch detection space of the detector;
wherein, in the rest position, the elastic covering is spaced apart from the touch-sensitive detector, and in the deformed position, the elastic covering is in contact with the touch-sensitive detector, and
wherein the touch-sensitive detector comprises a printed circuit having a touch detection electrode integrated thereon which is at least partially in register with the through hole, the elastic covering in the deformed position being directly in contact with the printed circuit.

2. A capacitive type control member comprising:
a support structure presenting a control zone, said control zone having a through hole;
a non-conductive elastic covering covering a control face of the control zone, at least in register with the through hole;
a touch-sensitive detector at least partially in register with the through hole and mounted on or in the vicinity of the face of the control zone that is opposite from its control face;
the elastic covering having a rest position in which the finger of an operator contacting the free surface of the elastic covering lies outside the touch detection space of the detector, and a deformed position in which the finger of the operator in contact with the free surface of the elastic covering lies within the touch detection space of the detector;
wherein, in the rest position, the elastic covering is spaced apart from the touch-sensitive detector, and in the deformed position, the elastic covering is in contact with the touch-sensitive detector, and
wherein the touch-sensitive detector comprises a printed circuit having a touch detection electrode integrated thereon which is at least partially in register with the through hole, and an electrically non-conductive coupling piece which is at least partially in register with the through hole and with the electrode, the coupling piece having a first face mounted in direct contact with the printed circuit, and a second face that is in direct contact with the elastic covering in the deformed position.

3. A control member according to claim 2, wherein the coupling piece comprises a light guide coupled with at least one light source.

4. A control member according to claim 2, wherein the coupling piece comprises an assembly spacer between the printed circuit and the face of the control zone opposite from the control face.

5. A control member according to claim 1, wherein the elastic covering is translucent, at least in register with the through hole.

6. A control member according to claim 1, wherein the elastic covering presents a pictogram in register with the through hole.

7. A control member according to claim 1, wherein the elastic covering presents a curve of resistance to depression between its rest position and its deformed position in the form of a slope that rises from the rest position to an intermediate position, and a slope that falls between the intermediate position and the deformed position.

8. A piece of motor vehicle cabin equipment comprising a self-supporting insert covered at least in part by a flexible skin, the piece of equipment including at least one control member according to claim 1.

9. A piece of equipment according to claim 8, wherein the self-supporting insert constitutes at least one control zone of at least one control member.

10. A piece of equipment according to claim 8, wherein the flexible skin constitutes the non-conductive elastic covering covering a control face of at least one control zone of at least one control member.

* * * * *